(12) United States Patent
Sato

(10) Patent No.: US 10,976,609 B2
(45) Date of Patent: Apr. 13, 2021

(54) LIGHTING DEVICE AND LIQUID CRYSTAL DISPLAY APPARATUS

(71) Applicant: Panasonic Liquid Crystal Display Co., Ltd., Himeji (JP)

(72) Inventor: Naoki Sato, Hyogo (JP)

(73) Assignee: PANASONIC LIQUID CRYSTAL DISPLAY CO., LTD., Hyogo (JP)

( * ) Notice: Subject to any disclaimer, the term of this patent is extended or adjusted under 35 U.S.C. 154(b) by 0 days.

(21) Appl. No.: 16/783,879

(22) Filed: Feb. 6, 2020

(65) Prior Publication Data

US 2020/0341337 A1 Oct. 29, 2020

Related U.S. Application Data

(60) Provisional application No. 62/839,225, filed on Apr. 26, 2019.

(51) Int. Cl.
*G02F 1/13357* (2006.01)

(52) U.S. Cl.
CPC .. *G02F 1/133609* (2013.01); *G02F 1/133603* (2013.01); *G02F 2001/133614* (2013.01)

(58) Field of Classification Search
None
See application file for complete search history.

(56) References Cited

U.S. PATENT DOCUMENTS

2016/0087164 A1* 3/2016 Kawano .............. C09K 11/663
  349/65
2018/0252967 A1* 9/2018 Li ........................ G02B 6/0023

FOREIGN PATENT DOCUMENTS

JP  2011-242488  12/2011
JP  2017-056679  3/2017

* cited by examiner

*Primary Examiner* — Richard H Kim
(74) *Attorney, Agent, or Firm* — Hamre, Schumann, Mueller & Larson, P.C.

(57) ABSTRACT

A lighting device includes: a light source including a light emitting element that emits light having an emission peak wavelength in a wavelength range of 500 nm or less; and first, second and third fluorescent substances on which light emitted from the light emitting element is incident, wherein the first fluorescent substance absorbs at least light emitted from the light emitting element to emit light having a emission peak wavelength in a wavelength range of 500 nm to 580 nm, the second fluorescent substance absorbs at least light emitted from the first fluorescent substance to emit light having a emission peak wavelength in a wavelength range of 580 nm to 750 nm, and the third fluorescent substance absorbs light having a wavelength range of 500 nm or less to emit light having a emission peak wavelength in a wavelength range of 600 nm to 750 nm.

14 Claims, 11 Drawing Sheets

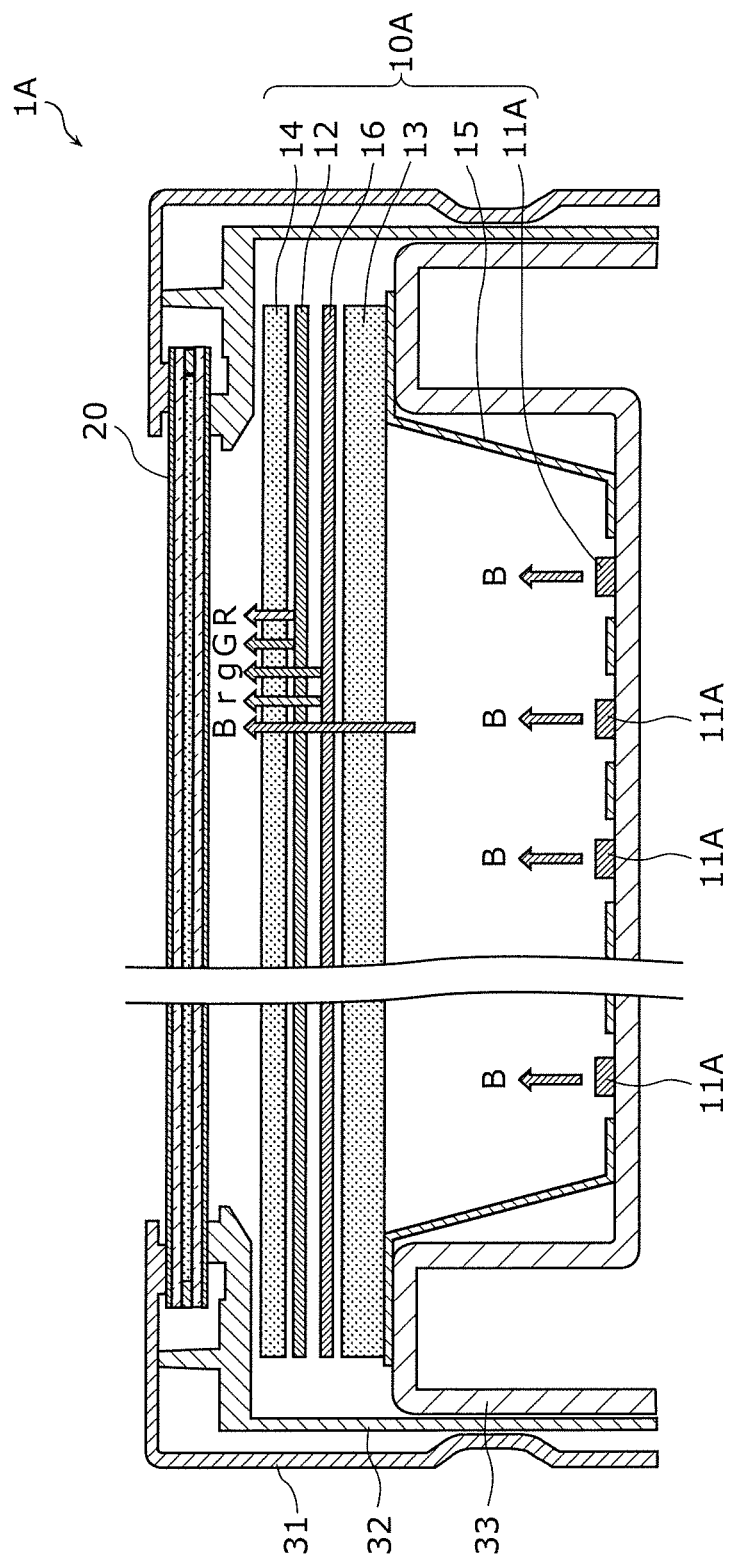

LIGHTING DEVICE AND LIQUID CRYSTAL DISPLAY APPARATUS

CROSS-REFERENCE TO RELATED APPLICATION

This application is based on and claims priority of U.S. Provisional Patent Application No. 62/839,225 filed on Apr. 26, 2019. The entire disclosure of the above-identified application, including the specification, drawings and claims is incorporated herein by reference in its entirety.

TECHNICAL FIELD

This disclosure relates to a lighting device and a liquid crystal display apparatus.

BACKGROUND

A liquid crystal display apparatus including a liquid crystal display panel can display an image with low power consumption, and thus is used as a display for various applications such as a television, a monitor, or a signage. The liquid crystal display apparatus includes a liquid crystal display panel and a backlight disposed on the back side of the liquid crystal display panel.

In recent years, an LED backlight using a light source composed of a light emitting diode (LED) has been used as a backlight of a liquid crystal display apparatus. In addition, the backlight is divided into an edge type backlight and a direct type backlight depending on an arrangement structure of the light source. Among these, the direct type LED backlight has a structure in which a plurality of LEDs are two-dimensionally arranged. For example, JP-A-2011-242488 discloses a liquid crystal display apparatus including a direct-type backlight having an LED light source composed of LEDs.

In the liquid crystal display apparatus, the backlight emits white light toward the liquid crystal display panel. There are several methods for realizing a backlight that emits the white light using LEDs.

For example, a method of obtaining white light by arranging three kinds of LED light sources, a red LED light source that emits red light, a green LED light source that emits green light, and a blue LED light source that emits blue light, and then combining three colors of light.

There is also a method of obtaining the white light by disposing a white LED light source in which a blue LED chip emitting blue light is sealed with a fluorescent substance-containing resin. In this case, as the white LED light source, a B-Y type LED light source packaged by combining a blue LED chip and a yellow fluorescent substance may be used, and a B-GR type LED light source packaged by combining a blue LED chip with a green fluorescent substance and a red fluorescent substance may be used in order to improve color reproducibility of a displayed image.

Alternatively, there is a method of obtaining white light by disposing a fluorescent sheet or a quantum dot sheet containing a fluorescent substance in front of the blue LED light source that emits the blue light. In this case, as a fluorescent sheet, there is a method of disposing a fluorescent sheet containing a yellow fluorescent substance, and in order to improve the color reproducibility of the display image, there is a method of disposing a fluorescent sheet containing a red fluorescent substance and a green fluorescent substance. For example, JP-A-2017-056679 discloses a backlight using a fluorescent sheet.

SUMMARY OF THE INVENTION

However, in these backlights in the related art, it is difficult to obtain light with a wide color gamut and high luminance that sufficiently satisfies BT. 2020. In particular, it is difficult to obtain light with the wide color gamut and the high luminance while achieving desired whiteness.

The present disclosure has been made to solve such a problem, and an object thereof is to provide a lighting device and a liquid crystal display apparatus that can irradiate light with a wide color gamut and high luminance.

According to an aspect of the present disclosure, there is provided a lighting device including a light source including a light emitting element that emits light having an emission peak wavelength in a wavelength range of 500 nm or less; and a first fluorescent substance, a second fluorescent substance, and a third fluorescent substance on which light emitted from the light emitting element is incident, in which the first fluorescent substance absorbs at least light emitted from the light emitting element to emit light having a emission peak wavelength in a wavelength range of 500 nm to 580 nm, the second fluorescent substance absorbs at least light emitted from the first fluorescent substance to emit light having a emission peak wavelength in a wavelength range of 580 nm to 750 nm, and the third fluorescent substance absorbs light having a wavelength range of 500 nm or less to emit light having a emission peak wavelength in a wavelength range of 600 nm to 750 nm.

According to another aspect of the present disclosure, there is provided a liquid crystal display apparatus including the lighting device and a liquid crystal display panel disposed on a light emission side of the lighting device.

It is possible to realize a lighting device or the like that can emit light in a wide color gamut with high luminance.

BRIEF DESCRIPTION OF THE DRAWINGS

FIG. 9 is a sectional view schematically illustrating a configuration of a liquid crystal display apparatus according to Modification Example 1.

DETAILED DESCRIPTION OF THE INVENTION

<Background to Obtaining One Embodiment of the Present Disclosure>

Figure 1:
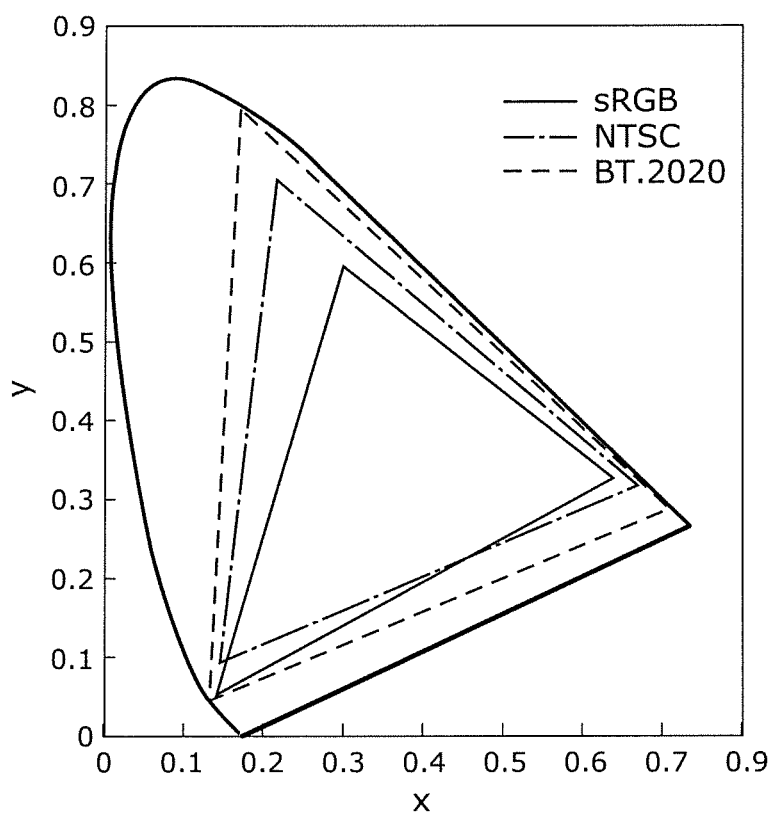
FIG. 1 is a diagram illustrating a standard of a color gamut of a display in an xy chromaticity diagram.

In recent years, image quality of displays has been improved, and in particular, a wide color gamut of displays has been demanded in order to improve color reproducibility. A color gamut is an element that determines a color reproduction range of a display image on a display, and is generally a range inside a triangle obtained by connecting three primary color points of a red display, a green display, and a blue display which are plotted on a chromaticity diagram, as illustrated in FIG. 1. Note that, FIG. 1 illustrates an xy chromaticity diagram based on a CIE-XYZ color system developed by Commission Internationale de l'Eclairage (CIE).

There are several standards for the color gamut of the display. Until now, the standards in accordance with NTSC have been common, but higher definition display standards such as 4K or 8K have been developing. For example, BT. 2020 international standards in a wider color gamut than NTSC have been established, and in the liquid crystal display apparatus mounted on a high-definition display, a high coverage is required in the BT. 2020 standard. For example, in a liquid crystal display apparatus that requires a wide color gamut, in the BT. 2020 standard, a coverage of 90% or more is required.

However, in a case where a B-Y type white LED light source combining a blue LED chip and a yellow fluorescent substance is used as a light source of the backlight, a high coverage cannot be achieved with the BT. 2020 standard. In order to satisfy the demand for wider color gamut, even in a case where a B-GR type white LED light source combining a blue LED chip, a green fluorescent substance, and a red fluorescent substance is used, the coverage of the BT. 2020 standard is limited to about 85%.

Therefore, in the liquid crystal display apparatus, by using an LED and a fluorescent sheet for the backlight, achieving high coverage in the BT. 2020 standard has been considered.

Figure 2:
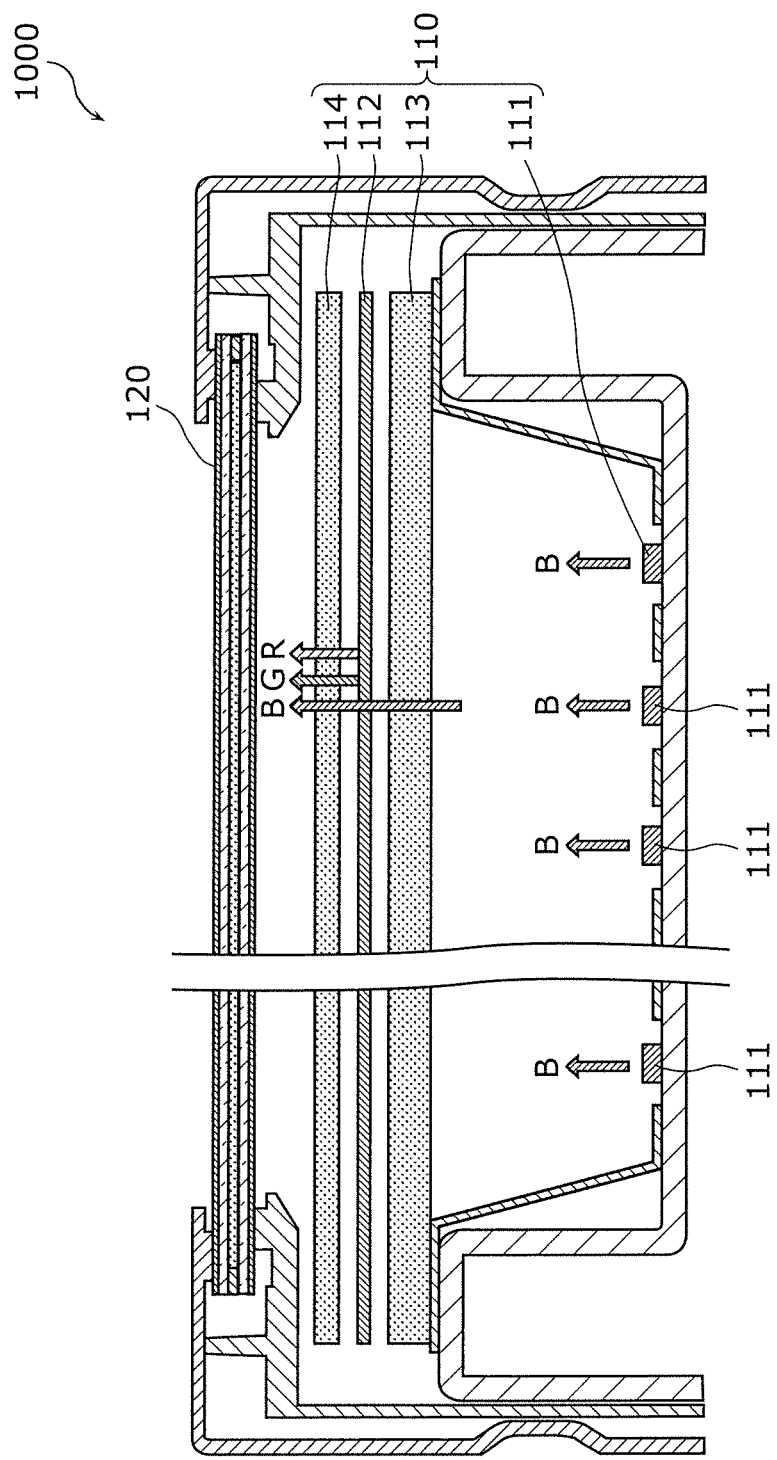
FIG. 2 is a sectional view schematically illustrating a configuration of a liquid crystal display apparatus of a comparative example.

Specifically, in a liquid crystal display apparatus 1000 illustrated in FIG. 2, a lighting device 110 including a plurality of LED light sources 111 arranged two-dimensionally and fluorescent sheets 112 is used as a direct type LED backlight disposed on the back side of a liquid crystal display panel 120. Note that, the lighting device 110 further includes a diffusion plate 113 and an optical sheet 114.

Each of the plurality of LED light sources 111 is a blue LED light source that emits blue light having a peak wavelength of 450 nm, for example. The fluorescent sheet 112 includes a fluorescent substance that emits fluorescence by the light of the light source 111. As the fluorescent sheet 112, a wide color gamut-compatible fluorescent sheet containing a green fluorescent substance that emits green light and a red fluorescent substance that emits red light is used in order to satisfy the demand for the wide color gamut. For example, when the fluorescent sheet 112 is irradiated with blue light having a wavelength of 450 nm, the fluorescent sheet 112 which is the wide color gamut-compatible fluorescent sheet can achieve 90% or more coverage in the BT. 2020 standard.

However, the fluorescent sheet 112 used in the liquid crystal display apparatus 1000 illustrated in FIG. 2 has a problem in that a desired whiteness (white balance) cannot be obtained. That is, in the liquid crystal display apparatus, there is a problem in that although white is displayed by synthesizing the three primary colors of RGB, a desired whiteness cannot be obtained on the fluorescent sheet 112 (the wide color gamut-compatible fluorescent sheet), and thus the display quality is deteriorated. For example, in an xy chromaticity diagram, a red component is insufficient, and the whiteness of the x coordinate is far from a target value.

Therefore, it was studied to bring the whiteness of both an x coordinate and a y coordinate closer to a target value by adjusting the concentration of the green fluorescent substance and the red fluorescent substance in the wide color gamut-compatible fluorescent sheet. For example, when the concentration of the green fluorescent substance and the red fluorescent substance was increased by about 2.8 times based on the wide color gamut-compatible fluorescent sheet used in FIG. 2, while maintaining the coverage of BT. 2020 to be 91%, the whiteness of both the x coordinate and the y coordinate was able to be set to the target value.

However, it has been found that the luminance of the wide color gamut-compatible fluorescent sheet in which the concentration of the green fluorescent substance and the red fluorescent substance are increased is greatly reduced.

Figure 3:
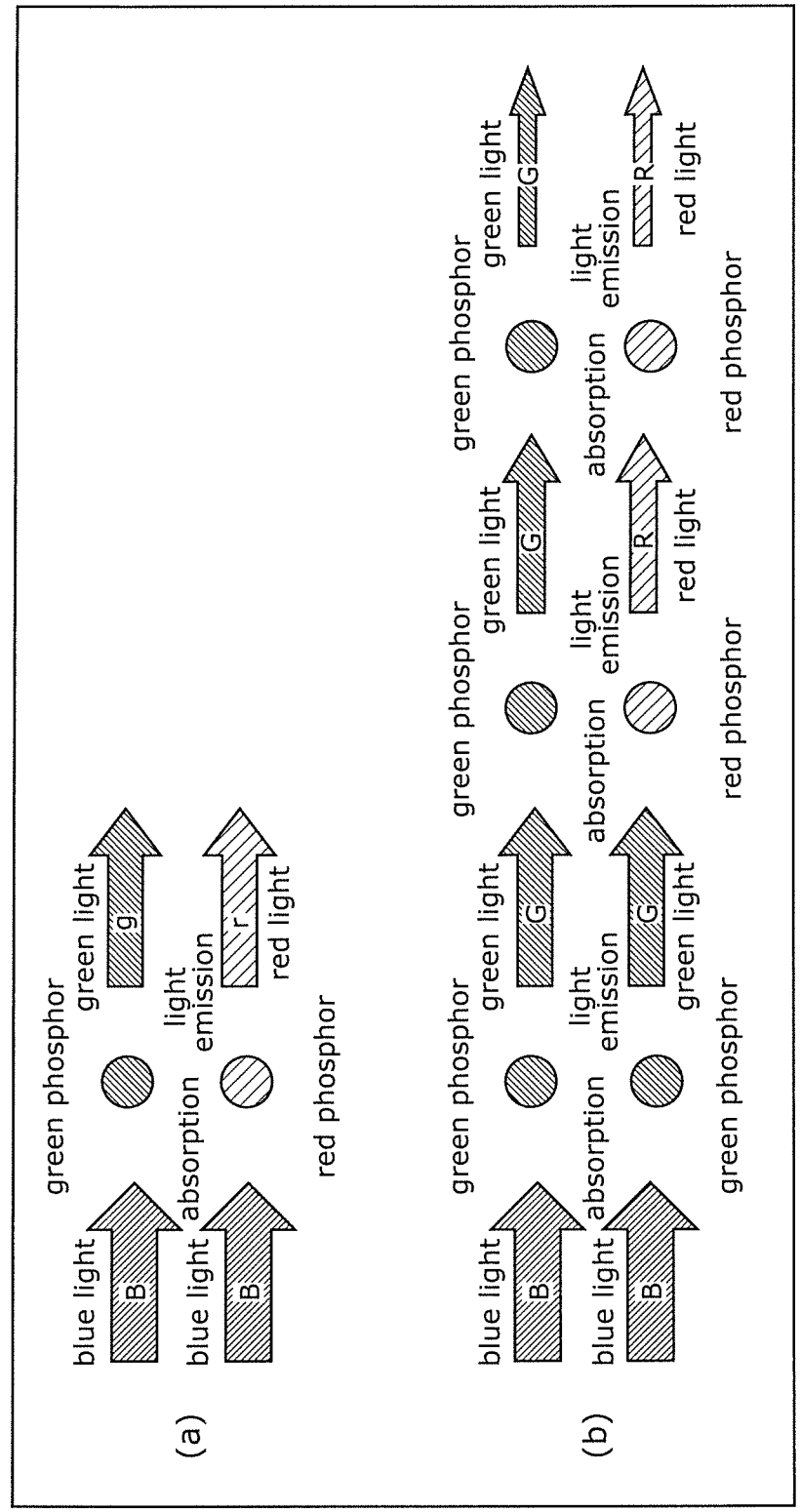
In FIG. 3, (a) is a diagram for explaining a light emission principle of a green fluorescent substance and a red fluorescent substance used for a general white LED light source and a fluorescent sheet, and (b) is a diagram for explaining the light emission principle of the green fluorescent substance and the red fluorescent substance used for a wide color gamut-compatible fluorescent sheet.

The inventors of the present application have examined the reason for this. As a result, the following matters have been found. The reason will be described with reference to FIG. 3. In FIG. 3, (a) is a diagram for explaining a light emission principle of a green fluorescent substance and a red fluorescent substance used for a general white LED light source and a fluorescent sheet, and (b) is a diagram for explaining the light emission principle of the green fluorescent substance and the red fluorescent substance used for a wide color gamut-compatible fluorescent sheet.

In a general white LED light source and a fluorescent sheet, as illustrated in (a) in FIG. 3, each of the green fluorescent substance and the red fluorescent substance directly absorbs the blue light of the blue LED chip and emits light, and thus there is little efficiency loss at the time of color conversion.

On the other hand, as illustrated in (b) in FIG. 3, the green fluorescent substance used for the wide color gamut-compatible fluorescent sheet absorbs blue light to emit light, as in the case of a general green fluorescent substance; however, the green fluorescent substance used for the wide color gamut-compatible fluorescent sheet not only absorbs the blue light to emit light but also absorbs the green light to emit light. That is, the green fluorescent substance used for the wide color gamut-compatible fluorescent sheet is a fluorescent substance that also absorbs (self-absorbs) its own fluorescence, and also absorbs the green light emitted by the green fluorescent substance itself to emit light.

Further, as illustrated in (b) FIG. 3, the red fluorescent substance used for the wide color gamut-compatible fluorescent sheet does not absorb the blue light to emit light, but absorbs the green light to emit light. Moreover, the red fluorescent substance used in the wide color gamut-compatible fluorescent sheet absorbs the red light to emit light. That is, the red fluorescent substance used for the wide color gamut-compatible fluorescent sheet is a fluorescent substance that also absorbs its own fluorescence, and also absorbs the red light emitted by the red fluorescent substance itself to emit light.

In this way, in the wide color gamut-compatible fluorescent sheet, the green fluorescent substance absorbs blue to green light to emit light, and the red fluorescent substance absorbs green to red light to emit light, and thus in the green fluorescent substance and the red fluorescent substance, absorption and emission of light are repeated, and the efficiency loss at the time of color conversion is increased.

Therefore, as described above, in the wide color gamut-compatible fluorescent sheet that can be obtained as a standard product, if the concentration of the green fluorescent substance and the red fluorescent substance is increased in order to increase the whiteness of the x coordinate, it is considered that more color conversion occurred than before increasing the concentration of the green fluorescent substance and the red fluorescent substance. As a result, it is considered that the efficiency loss at the time of color conversion is very large and the luminance is greatly reduced for the wide color gamut-compatible fluorescent sheet in which the concentration of the green fluorescent substance and the red fluorescent substance are increased.

The technology of the present disclosure has been made based on such knowledge, and as a result of intensive studies by the inventors of the present application, it has been found that when a specific fluorescent substance is added even in a case of using the wide color gamut-compatible fluorescent sheet, it is possible to realize a lighting device capable of irradiating light with the wide color gamut and high luminance while achieving desired whiteness.

Embodiments

Hereinafter, embodiments of the present disclosure will be described. Note that each of the embodiments described below indicates a specific example of the present disclosure. Accordingly, numerical values, shapes, materials, components, and arrangement positions and connection forms of constituent components described in the following embodiments are merely examples, and are not intended to limit the present disclosure. Therefore, among the constituent components in the following embodiments, constituent components not described in the independent claims are described as optional constituent components.

Each drawing is a schematic diagram and is not necessarily illustrated strictly. Accordingly, the scales and the like do not necessarily match in each drawing. In each drawing, substantially the same configuration is denoted by the same reference numeral, and redundant description is not repeated or simplified.

Embodiments

Figure 4:
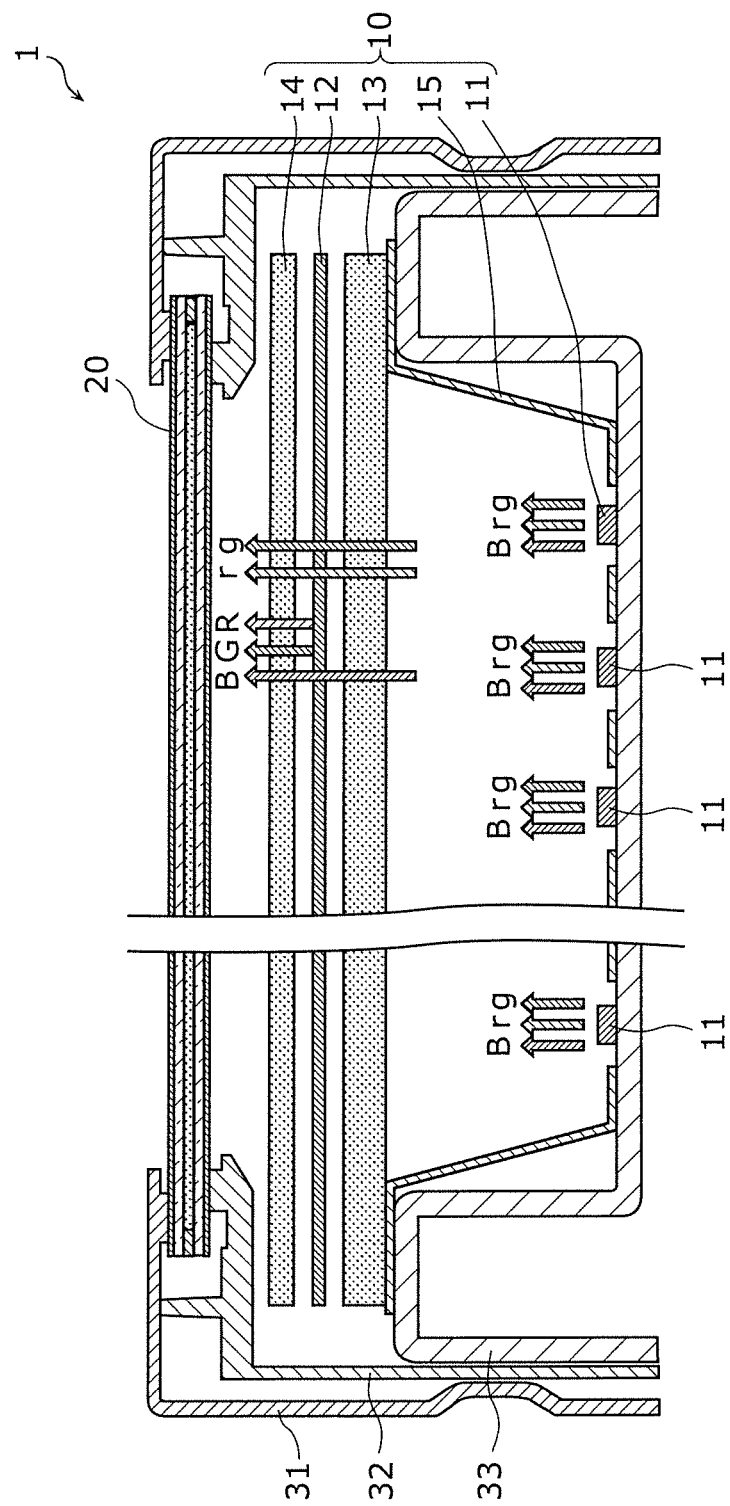
FIG. 4 is a sectional view schematically illustrating a configuration of a liquid crystal display apparatus according to an embodiment.

First, a configuration of a lighting device 10 and a liquid crystal display apparatus 1 according to the embodiment will be described with reference to FIG. 4. FIG. 4 is a sectional view schematically illustrating a configuration of the liquid crystal display apparatus 1 according to the embodiment.

As illustrated in FIG. 4, the liquid crystal display apparatus 1 includes the lighting device 10 and a liquid crystal display panel 20. The liquid crystal display apparatus 1 further includes a first frame 31, a second frame 32, and a third frame 33 in order to hold the lighting device 10 and the liquid crystal display panel 20.

The lighting device 10 is a backlight disposed on the back side of the liquid crystal display panel 20 and irradiates the liquid crystal display panel 20 with light. In the present embodiment, the lighting device 10 is a direct type LED backlight in which LEDs are two-dimensionally arranged so as to face the liquid crystal display panel 20, and irradiates flat scattered light (diffused light). The lighting device 10 irradiates white light as illumination light.

Moreover, the lighting device 10 may be an LED backlight corresponding to local dimming for a high dynamic range (HDR), for example, and emits light with high luminance. With this, the liquid crystal display apparatus 1 capable of displaying a color image with high contrast and high image quality can be realized. Note that, a detailed configuration of the lighting device 10 will be described later.

The liquid crystal display panel 20 is disposed on the light emission side of the lighting device 10. The liquid crystal display panel 20 displays a color image or a monochrome image in an image display area. In the present embodiment, the liquid crystal display panel 20 displays a color image. A method of driving the liquid crystal display panel 20 is, for example, a lateral electric field method such as an In plane switching (IPS) method or a fringe field switching (FFS) method, and may be a vertical alignment (VA) method or a twisted nematic (TN) method.

The liquid crystal display panel 20 includes, for example, a liquid crystal cell having a pair of transparent substrates and a liquid crystal layer sealed between the pair of transparent substrates; and a pair of polarizing plates attached to the respective outer surfaces of the pair of transparent substrates of the liquid crystal cell. As the transparent substrate, a glass substrate or a transparent resin substrate can be used. In addition, the liquid crystal material of the liquid crystal layer can be appropriately selected according to the method of driving the liquid crystal display panel 20.

The transparent substrate on the lighting device10-side (rear side) of the pair of transparent substrates is a TFT substrate having thin film transistors (TFT) provided corresponding to each of a plurality of pixels arranged in a matrix. Further, the transparent substrate on the display surface-side (front side) of the pair of transparent substrates is a counter substrate facing the TFT substrate. On the counter substrate, a color filter (CF) and a black matrix are formed.

On the TFT substrate, a plurality of video signal lines and a plurality of scanning signal lines are formed orthogonal to each other. The scanning signal lines are respectively provided for each horizontal row of pixels, for example, and are connected to a TFT gate electrode of each pixel. The video signal lines are respectively provided for each vertical column of pixels, for example, and are connected to a source electrode of the TFT of each pixel. Pixel electrodes formed in each pixel are connected to a drain electrode of the TFT of each pixel.

The TFTs of each pixel is on/off controlled in units of horizontal rows in accordance with a scanning signal applied to the gate electrode via the scanning signal line. When the TFT is turned on, a data voltage is supplied to a pixel electrode corresponding to the TFT from the video signal line connected to the TFT. An electric field is generated in the liquid crystal layer due to the difference between the data voltage supplied to the pixel electrode and a common voltage supplied to a common electrode. This electric field changes an alignment state of liquid crystal molecules in the liquid crystal layer in each pixel, and the transmittance for light incident on the liquid crystal display panel 20 from the lighting device 10 is changed, and thereby a desired image is displayed in the image display area of the liquid crystal display panel 20.

The first frame 31 is a front frame disposed on the front side. In the present embodiment, the first frame 31 is, for example, a metal frame having a rectangular frame shape in a plan view and an L-shaped cross section, and is formed of a metal material having high rigidity such as a steel plate or an aluminum plate. In the present embodiment, the first frame 31 includes a bezel portion that covers a peripheral portion of the liquid crystal display panel 20 and a side wall portion that is positioned on the side of the liquid crystal display panel 20 and the lighting device 10. The bezel portion protrudes in a flange shape from an upper end of the side wall portion, and is formed in a frame shape so as to cover the entire outer peripheral end of the surface of the liquid crystal display panel 20.

The second frame 32 is a middle frame disposed between the first frame 31 and the third frame 33. The second frame 32 supports the liquid crystal display panel 20 from the lighting device 10 side. As the second frame 32, a mold frame formed by molding a synthetic resin can be used. However, the material of the second frame 32 is not limited to a resin material, and may be a metal material. In the present embodiment, the second frame 32 has a side wall portion and a protruding portion that protrudes inward from the side wall portion. The outer peripheral end of the liquid crystal display panel 20 is positioned between the protruding portion of the second frame 32 and the bezel portion of the first frame 31.

The third frame 33 is a rear frame disposed on the back side. In the present embodiment, the third frame 33 is a metal casing formed in a concave shape as a whole, and is made of a metal material having high rigidity, such as a steel plate or an aluminum plate. In the present embodiment, the third frame 33 has a box-shaped main body that accommodates a light source 11 of the lighting device 10 therein. Note that, the third frame 33 may be one of the members constituting the lighting device 10.

Next, the detailed configuration of the lighting device 10 in the present embodiment will be described with reference to FIG. 4.

The lighting device 10 is provided with at least one light source 11 and a fluorescent sheet 12 including different types of first and second fluorescent substances. The lighting device 10 in the present embodiment is further provided with a diffusion plate 13, an optical sheet 14, and a reflecting plate 15.

The light source 11 serves as a light source of the lighting device 10 serving as a backlight. The light source 11 is an LED light source made of LEDs. In the present embodiment, since the lighting device 10 is a direct type backlight, a plurality of light sources 11 are arranged. Specifically, the plurality of light sources 11 are two-dimensionally arranged. More specifically, the plurality of light sources 11 are arranged in a matrix along horizontal rows (row direction) and vertical columns (column direction) of pixels of the liquid crystal display panel 20. Although not shown, the plurality of light sources 11 are mounted on a mounting board disposed at a bottom of the third frame 33.

Each light source 11 includes a light emitting element that emits light having an emission peak wavelength in a wavelength range of 500 nm or less. In the present embodiment, the light emitting element of the light source 11 emits light having an emission peak wavelength in a wavelength range of 400 nm to 500 nm. Specifically, the light emitting element of the light source 11 is a blue LED chip that emits blue light having an emission peak wavelength of around 450 nm.

As an example, each light source 11 is a packaged surface mount device (SMD) type LED light source including, a white resin package having a recess, a blue LED chip (bare chip) that is primarily mounted on the bottom surface of the recess of the package, and a sealing member sealed in the recess of the package. The sealing member is made of a transparent resin material such as a silicone resin.

In the present embodiment, each light source 11 includes a third fluorescent substance and a fourth fluorescent substance that are different from the first fluorescent substance and the second fluorescent substance of the fluorescent sheet 12. For example, the third fluorescent substance and the fourth fluorescent substance are dispersed in the sealing member that seals the blue LED chip. Specifically, the sealing member is a fluorescent substance-containing resin in which the third fluorescent substance and the fourth fluorescent substance are dispersed. Note that, the sealing member may include a light diffusing material such as a filler.

The third fluorescent substance absorbs light having a wavelength of 500 nm or less to emit light having a emission peak wavelength in a wavelength range of 600 nm to 750 nm. More specifically, the third fluorescent substance absorbs light having a wavelength of 500 nm or less to emit light having a emission peak wavelength in a wavelength range of 600 nm to 650 nm. That is, the third fluorescent substance is a red fluorescent substance that emits red light. The third fluorescent substance has an absorption spectrum peak in a wavelength range of 430 nm to 470 nm. In the present embodiment, since the light source 11 has the blue LED chip that emits the blue light having an emission peak wavelength of around 450 nm, the third fluorescent substance emits the red light by the blue light of the blue LED chip.

Figure 5:
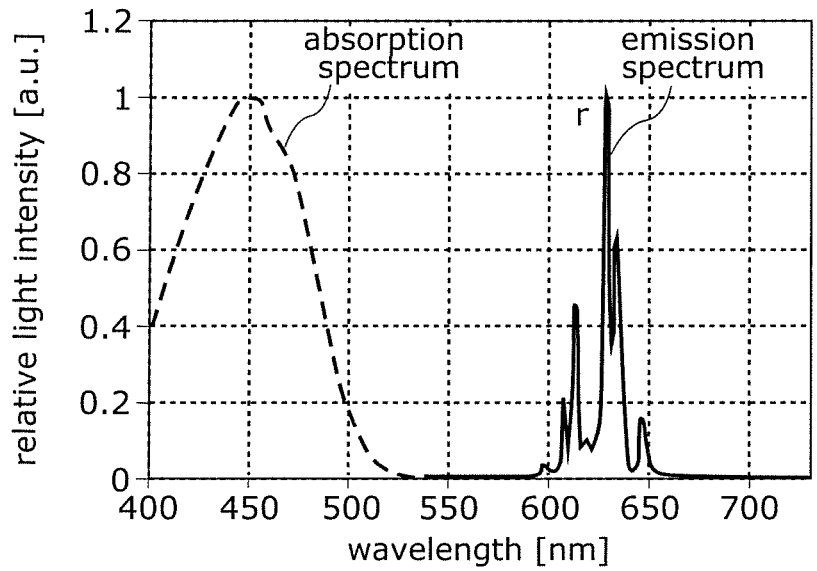
FIG. 5 is a diagram illustrating an absorption spectrum and an emission spectrum of a KSF fluorescent substance.

As an example, the third fluorescent substance is a fluoride red fluorescent substance, for example, a KSF ($K_2SiF_6$:Mn) fluorescent substance having an absorption spectrum (excitation spectrum) and an emission spectrum as illustrated in FIG. 5. Therefore, the third fluorescent substance used in the present embodiment absorbs light having a wavelength of about 450 nm and emits light having a wavelength of about 630 nm. In addition, the KSF fluorescent substance has a narrow spectrum width of emitted light and a sharp emission peak wavelength. With this, a wide color gamut can be easily realized.

The fourth fluorescent substance absorbs light having a wavelength of less than 500 nm to emit light having a emission peak wavelength in a wavelength range of 500 nm to 580 nm. In the present embodiment, the fourth fluorescent substance absorbs at least the light emitted from the light emitting element of the light source 11 to emit light having a emission peak wavelength in a wavelength range of 500 nm to 580 nm. More specifically, the fourth fluorescent substance absorbs the light emitted from the light emitting element of the light source 11 to emit light having a emission peak wavelength in a wavelength range of 500 nm to 560 nm. That is, the fourth fluorescent substance is a green fluorescent substance that emits green light. The fourth fluorescent substance has an absorption spectrum peak in a wavelength range of 250 nm to 350 nm, and may absorb light in a wide wavelength range of 250 nm to 550 nm. In the present embodiment, since the light source 11 has the blue LED chip that emits the blue light having an emission peak wavelength of around 450 nm, the fourth fluorescent substance emits the green light by the blue light of the blue LED chip.

Figure 6:
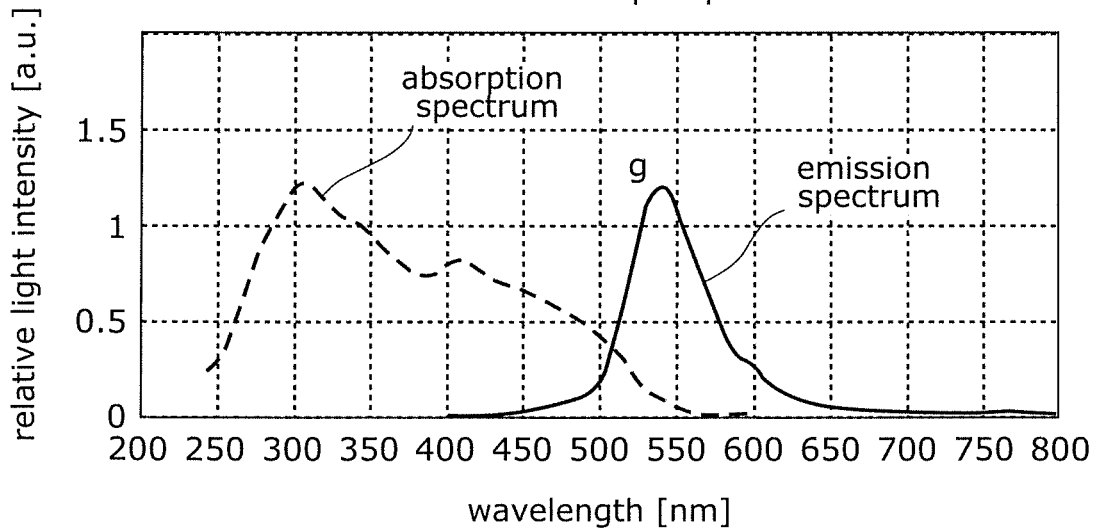
FIG. 6 is a diagram illustrating an absorption spectrum and an emission spectrum of a $\beta$-SiAlON fluorescent substance.

As an example, the fourth fluorescent substance is a silicate green fluorescent substance, for example, a β-SiA-lON fluorescent substance having an absorption spectrum (excitation spectrum) and an emission spectrum as illustrated in FIG. 6. Therefore, the fourth fluorescent substance used in the present embodiment emits light having a emission peak wavelength in a wavelength range of 520 nm to 550 nm, and more specifically, 545 nm to 550 nm.

In the light source 11 configured as described above, the third fluorescent substance included in the light source 11 absorbs the blue light of the blue LED chip, which is also a light emitting element included in the light source 11, and is excited to emit red light fluorescence. Similarly, the fourth fluorescent substance included in the light source 11 absorbs the blue light of the blue LED chip, which is also a light emitting element included in the light source 11, and is excited to emit green light fluorescence. For this reason, from the light source 11, the light including a blue light (B) emitted from the blue LED chip, a red light (r) emitted from the third fluorescent substance, which is the KSF fluorescent substance, and a green light (g) emitted from the fourth fluorescent substance, which is the β-SiAlON fluorescent substance is emitted.

In the present embodiment, the light source 11 includes the third fluorescent substance and the fourth fluorescent substance. However, the present embodiment is not limited to this. Specifically, the light source 11 may include only the third fluorescent substance among the third fluorescent substance and the fourth fluorescent substance.

The fluorescent sheet 12 is disposed in front (light emission side) of the light source 11. Therefore, the light emitted from the light source 11 is incident on the fluorescent sheet 12. The fluorescent sheet 12 is a color conversion sheet that converts the color of incident light.

Here, as described above, the fluorescent sheet 12 includes different types of first fluorescent substance and second fluorescent substance as color conversion materials. Specifically, the fluorescent sheet 12 is a sheet member in which the first fluorescent substance and the second fluorescent substance are dispersed in a transparent base material. As the transparent base material of the fluorescent sheet 12, a resin substrate (base resin) made of a transparent resin material such as an epoxy resin, a silicone resin, an acrylic resin, or a polyester resin can be used. These resin materials serve as binder resins for the first fluorescent substance and the second fluorescent substance.

Figure 7A:
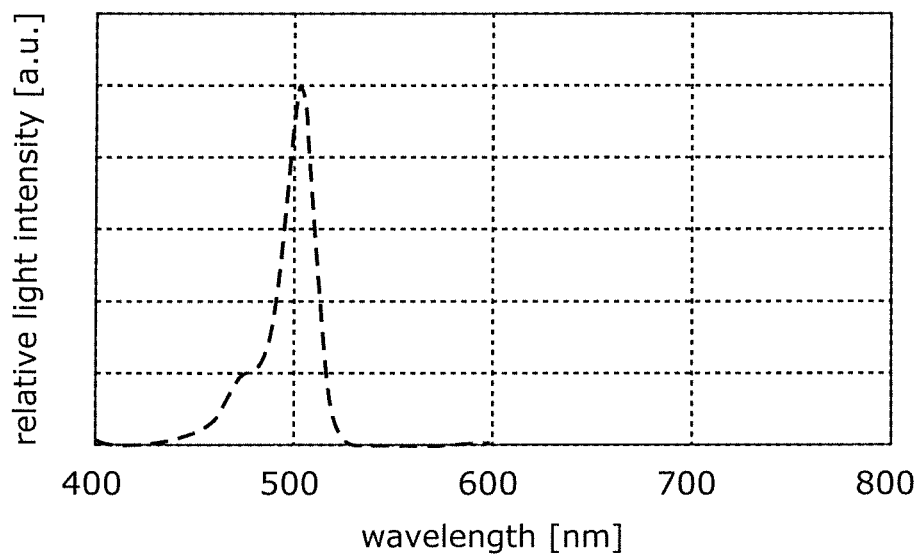
FIG. 7A is a diagram illustrating an absorption spectrum of a first fluorescent substance contained in the fluorescent sheet used in the lighting device according to the embodiment.
Figure 7B:
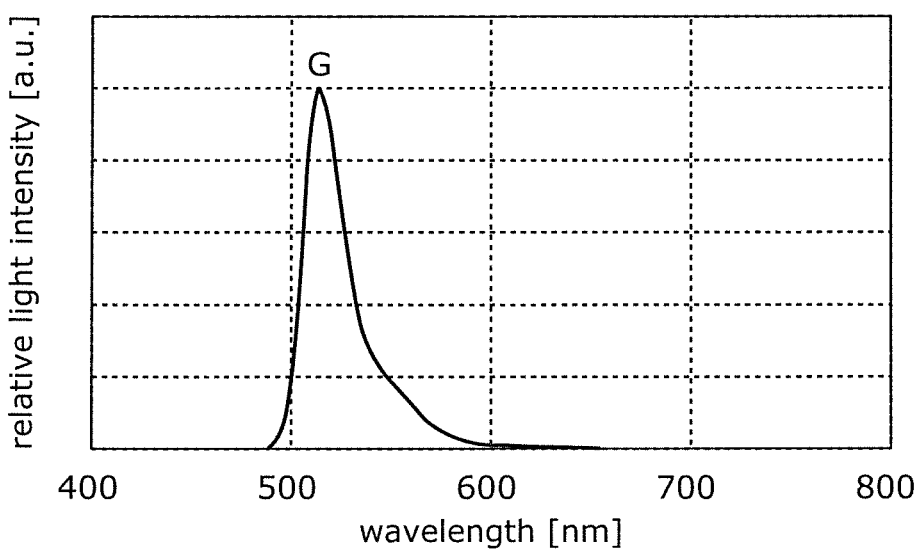
FIG. 7B is a diagram illustrating an emission spectrum of the first fluorescent substance contained in the fluorescent sheet used in the lighting device according to the embodiment.

The first fluorescent substance absorbs at least light emitted from the light emitting element of the light source 11 to emit light having a emission peak wavelength in a wavelength range of 500 nm to 580 nm. More specifically, the first fluorescent substance emits light having a emission peak wavelength in a wavelength range of 500 nm to 550 nm. In the present embodiment, the first fluorescent substance is a green fluorescent substance made of an organic wavelength conversion material consisting of the following compound, and emits a green light (G). As an example, the first fluorescent substance has an absorption spectrum illustrated in FIG. 7A and an emission spectrum illustrated in FIG. 7B. Therefore, the first fluorescent substance used in the present embodiment absorbs light having a wavelength of about 500 nm and emits light having a wavelength of about 540 nm. In the present embodiment, the first fluores-cent substance has an absorption spectrum peak in the wavelength range of 470 nm to 520 nm.

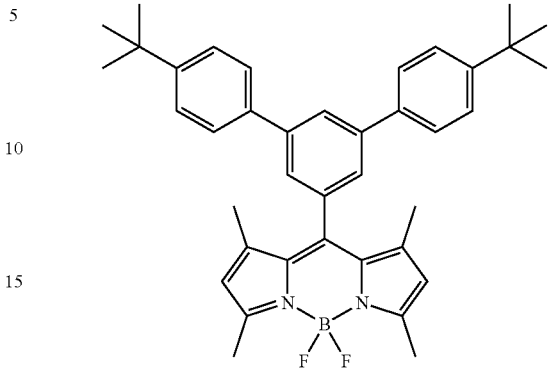

Figure 8A:
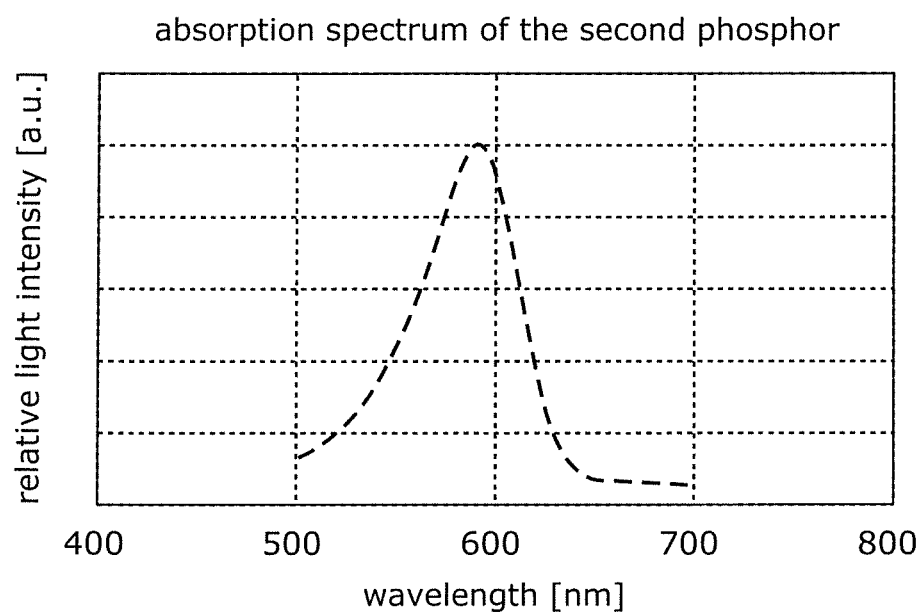
FIG. 8A is a diagram illustrating an absorption spectrum of a second fluorescent substance contained in the fluorescent sheet used in the lighting device according to the embodiment.
Figure 8B:
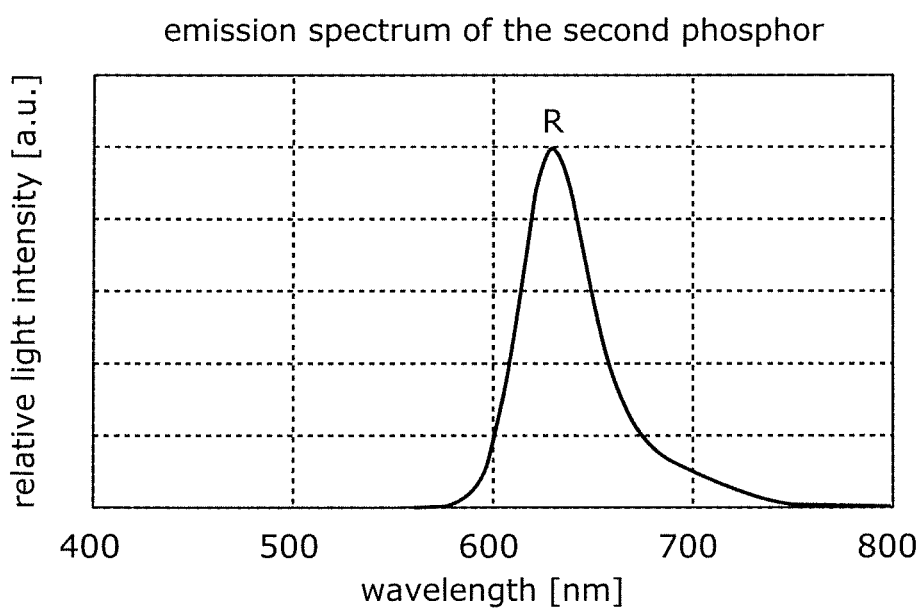
FIG. 8B is a diagram illustrating an emission spectrum of the second fluorescent substance contained in the fluorescent sheet used in the lighting device according to the embodiment.

On the other hand, the second fluorescent substance absorbs at least the light emitted from the first fluorescent substance to emit light having a emission peak wavelength in a wavelength range of 580 nm to 750 nm. More specifically, the second fluorescent substance emits light having a emission peak wavelength in a wavelength range of 580 nm to 680 nm. In the present embodiment, the second fluorescent substance is a red fluorescent substance made of an organic wavelength conversion material consisting of the following compound, and emits a red light (R). As an example, the second fluorescent substance has an absorption spectrum illustrated in FIG. 8A and an emission spectrum illustrated in FIG. 8B. Therefore, the second fluorescent substance used in the present embodiment absorbs light having a wavelength of about 580 nm and emits light having a wavelength of about 650 nm. In the present embodiment, the second fluorescent substance has an absorption spectrum peak in the wavelength range of 550 nm to 620 nm.

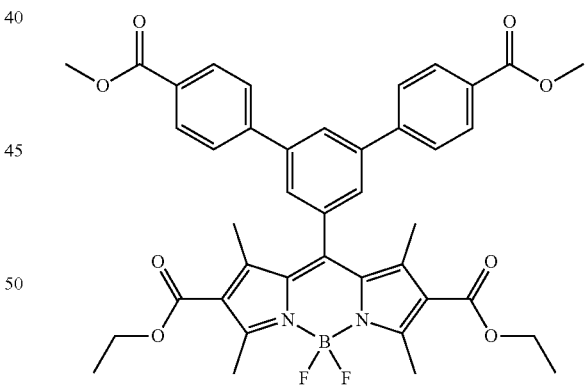

The fluorescent sheet 12 including the first fluorescent substance and the second fluorescent substance emits light having an emission spectrum corresponding to the fluorescent sheet 112 of FIG. 2 in a case of being irradiated with the blue light having a peak wavelength of 450 nm. For example, when the fluorescent sheet 12 is irradiated with only the blue light from the blue LED chip included in the light source 11, the white light having a spectral distribution corresponding to the fluorescent sheet 112 in FIG. 2 is emitted from the fluorescent sheet 12.

The diffusion plate 13 is a diffusion member that diffuses (scatters) the light emitted from the plurality of light sources 11, and is disposed in front of the plurality of light sources 11. In the present embodiment, the diffusion plate 13 is disposed between the light source 11 and the fluorescent sheet 12. Therefore, the light from the light source 11 diffused by the diffusion plate 13 incident on the fluorescent sheet 12.

The optical sheet 14 is an optical member that imparts an optical action to the light emitted from the light source 11, and is disposed in front (light emission side) of the plurality of light sources 11. In the present embodiment, the optical sheet 14 is disposed in front of the fluorescent sheet 12. Specifically, the optical sheet 14 is disposed between the liquid crystal display panel 20 and the fluorescent sheet 12. Therefore, the optical sheet 14 imparts an optical action to the light emitted from the fluorescent sheet 12. The optical sheet 14 is, for example, a prism sheet, a diffusion sheet, or a polarizing sheet. Further, the number of the optical sheets 14 is not limited to one, and it may be made of a plurality of sheets selected from a prism sheet, a diffusion sheet, and a polarizing sheet.

The reflecting plate 15 is a reflecting member having a function of reflecting the light from the plurality of light sources 11. The light from the light source 11 reflected by the reflecting plate 15 is incident on the diffusion plate 13. In the present embodiment, the reflecting plate 15 has a reflecting portion arranged at a bottom of a main body portion of the third frame 33, and a plurality of rectangular openings corresponding to the respective light sources 11 are formed in the reflecting portion. The reflecting plate 15 is made of a thin metal plate such as a steel plate or an aluminum plate. In this case, the surface of the reflecting plate 15 is preferably white-coated. Note that, the reflecting plate 15 may be a reflecting sheet made of a white resin material.

Next, the optical action of the lighting device 10 according to the present embodiment will be described with reference to FIG. 4.

In the lighting device 10 according to the present embodiment, the light source 11 includes the blue LED chip, the third fluorescent substance, and the fourth fluorescent substance. Therefore, as illustrated in FIG. 4, the light source 11 emits the blue light (B) from the blue LED chip, the red light (r) from the third fluorescent substance that fluoresces using a part of the blue light from the blue LED chip as excitation light, and the green light (g) from the fourth fluorescent substance that fluoresces using another part of the blue light of the blue LED chip as excitation light.

The blue light (B), the red light (r), and the green light (g) emitted from the light source 11 are diffused by the diffusion plate 13 and incident on the fluorescent sheet 12. At this time, the fluorescent sheet 12 includes the first fluorescent substance having the absorption spectrum of FIG. 7A and the emission spectrum of FIG. 7B, and the second fluorescent substance having the absorption spectrum of FIG. 8A and the emission spectrum of FIG. 8B. Therefore, the fluorescent sheet 12 emits the green light (G) from the first fluorescent substance that has absorbed and fluoresced using a part of the blue light (B) of the blue LED chip, and the red light (R) from the second fluorescent substance that has absorbed and fluoresced the green light (G) of the first fluorescent substance and the green light (g) of the fourth fluorescent substance.

Since the first fluorescent substance and the second fluorescent substance are fluorescent substances that also absorb their own fluorescence, the first fluorescent substance absorbs a part of the green light emitted by itself and a part of the green light emitted by the fourth fluorescent substance to emit the green light, and the second fluorescent substance absorbs a part of the red light emitted by itself to emit the red light.

Further, the fluorescent sheet 12 emits not only the blue light (B) of the blue LED chip that has been transmitted through the fluorescent sheet 12 without being absorbed by the first fluorescent substance, but also the red light (r) of the third fluorescent substance and the green light (g) of the fourth fluorescent substance that are incident on the fluorescent sheet 12 to transmit through the fluorescent sheet 12.

Therefore, as illustrated in FIG. 4, the fluorescent sheet 12 emits white light in which the blue light (B) by the blue LED chip, the green light (G) by the first fluorescent substance, the red light (R) by the second fluorescent substance, the red light (r) by the third fluorescent substance, and the green light (g) by the fourth fluorescent substance are synthesized.

Note that, the white light emitted from the fluorescent sheet 12 receives an optical action by the optical sheet 14 and incident on the liquid crystal display panel 20.

As described above, the lighting device 10 and the liquid crystal display apparatus 1 according to the present embodiment include the fluorescent sheet 12 including the first fluorescent substance that absorbs light emitted from the light emitting element of the light source 11 and emits light having a emission peak wavelength in a wavelength range of 500 nm to 580 nm and the second fluorescent substance that absorbs light emitted from the first fluorescent substance and emits light having a emission peak wavelength in a wavelength range of 580 nm to 750 nm; and the light source 11 including the third fluorescent substance that absorbs light having a wavelength of 500 nm or less and emits light having a emission peak wavelength in a wavelength range of 600 nm to 750 nm and the light emitting element that emits light having a emission peak wavelength in a wavelength range of 500 nm or less.

That is, the lighting device 10 and the liquid crystal display apparatus 1 according to the present embodiment include not only the fluorescent sheet 12 which is a wide color gamut fluorescent sheet including the first fluorescent substance and the second fluorescent substance, but also the third fluorescent substance that emits the red light by being excited by the light of the light emitting element included in the light source 11 without being substantially excited by the light of the first fluorescent substance and the second fluorescent substance.

With this, even if the third fluorescent substance is added in addition to the first fluorescent substance and the second fluorescent substance, the third fluorescent substance hardly absorbs the light of the first fluorescent substance and the second fluorescent substance, but directly absorbs light of the light emitting element included in the light source 11, and thus efficiency loss at the time of color conversion can be suppressed. Therefore, since the red component that has been lacking in the wide color gamut fluorescent sheet can be compensated without lowering the luminance, it is possible to obtain the lighting device 10 capable of irradiating light with a wide color gamut and high luminance while achieving a desired whiteness. Therefore, the liquid crystal display apparatus 1 having excellent display quality can be obtained.

Moreover, in the lighting device 10 and the liquid crystal display apparatus 1 according to the present embodiment, the light source 11 further includes the fourth fluorescent substance that absorbs the light emitted from at least the light emitting element to emit the light having a emission peak wavelength in a wavelength range of 500 nm to 580 nm.

With this, since the green component can be compensated, it is possible to obtain the lighting device 10 capable of irradiating light with a wide color gamut and high luminance while further achieving a desired whiteness. Note that, in a case where the light emitted from the lighting device 10 fully contains the green component without the fourth fluorescent substance, the fourth fluorescent substance may not be provided.

Note that, in the lighting device 10 according to the present embodiment, the third fluorescent substance and the fourth fluorescent substance are contained in the light source 11 which has the light emitting element. With this, the third fluorescent substance can be added, without increasing the number of parts.

Modification Example 1

Next, a liquid crystal display apparatus 1A and a lighting device 10A according to Modification Example 1 will be described with reference to FIG. 9. FIG. 9 is a sectional view schematically illustrating a configuration of the liquid crystal display apparatus 1A according to Modification Example 1.

In the liquid crystal display apparatus 1 and the lighting device 10 according to the above-described embodiment, the light source 11 includes the third fluorescent substance and the fourth fluorescent substance; whereas, in the liquid crystal display apparatus 1A and the lighting device 10A according to the present modification, a fluorescent sheet including a third fluorescent substance and a fourth fluorescent substance is separately provided.

Specifically, as illustrated in FIG. 9, the lighting device 10A according to the present modification example further includes a second fluorescent sheet 16 including the third fluorescent substance and the fourth fluorescent substance, while the fluorescent sheet 12 is a first fluorescent sheet. The second fluorescent sheet 16 is disposed between the light source 11 and the fluorescent sheet 12 (first fluorescent sheet).

The second fluorescent sheet 16 is a sheet member in which the third fluorescent substance and the fourth fluorescent substance are dispersed in a transparent base material serving as a binder. As the transparent substrate of the second fluorescent sheet 16, similarly to the fluorescent sheet 12, a resin base material (base resin) made of a transparent resin material such as an epoxy resin, a silicone resin, an acrylic resin, or a polyester resin can be used.

In the present modification examples, a light source 11A does not include the third fluorescent substance and the fourth fluorescent substance. Specifically, the light source 11A has a configuration in which the third fluorescent substance and the fourth fluorescent substance are excluded from the light source 11 in the above embodiment. Accordingly, the light source 11A is a blue LED light source that emits only the blue light (B) emitted from the blue LED chip.

The blue light (B) emitted from the light source 11A is diffused by the diffusion plate 13 and incident on the second fluorescent sheet 16. At this time, since the second fluorescent sheet 16 includes the third fluorescent substance having the absorption spectrum and the emission spectrum as illustrated in FIG. 5 and the fourth fluorescent substance having the absorption spectrum and the emission spectrum as illustrated in FIG. 6, the second fluorescent sheet 16 emits the red light (r) from the third fluorescent substance that has absorbed and fluoresced using a part of the blue light (B) of the blue LED chip, the green light (g) from the fourth fluorescent substance that has absorbed and fluoresced using another part of the blue light (B) of the blue LED chip, and the blue light (B) of the blue LED chip that has transmitted through the second fluorescent sheet 16 without being absorbed in the third fluorescent substance.

The blue light (B), the red light (r), and the green light (g) emitted from the second fluorescent sheet 16 are incident on the fluorescent sheet 12. The fluorescent sheet 12 includes the first fluorescent substance having the absorption spectrum of FIG. 7A and the emission spectrum of FIG. 7B, and the second fluorescent substance having the absorption spectrum of FIG. 8A and the emission spectrum of FIG. 8B. Therefore, as in the above embodiment, the fluorescent sheet 12 emits the green light (G) from the first fluorescent substance that has absorbed and fluoresced using a part of the blue light (B) of the blue LED chip, and the red light (R) from the second fluorescent substance that has absorbed and fluoresced the green light (G) of the first fluorescent substance and the green light (g) from the fourth fluorescent substance.

Further, the fluorescent sheet 12 emits not only the blue light (B) of the blue LED chip that is incident on the fluorescent sheet 12, but also the red light (r) of the third fluorescent substance and the green light (g) of the fourth fluorescent substance that are incident on the fluorescent sheet 12.

As a result, as in the above embodiment, the fluorescent sheet 12 emits white light in which the blue light (B) by the blue LED chip, the green light (G) by the first fluorescent substance, the red light (R) by the second fluorescent substance, the red light (r) by the third fluorescent substance, and the green light (g) by the fourth fluorescent substance are synthesized.

As described above, similar to the lighting device 10 and the liquid crystal display apparatus 1 according to the above embodiment, the lighting device 10A and the liquid crystal display apparatus 1A according to the present modification example include not only the first fluorescent substance and the second fluorescent substance of the fluorescent sheet 12 which is a wide color gamut fluorescent sheet, but also the third fluorescent substance that emits the red light by being excited by the light of the light emitting element included in the light source 11A without being substantially excited by the light of the first fluorescent substance and the second fluorescent substance.

Therefore, since the red component that has been lacking in the wide color gamut fluorescent sheet can be compensated while ensuring the luminance, it is possible to obtain the lighting device 10A capable of irradiating light with a wide color gamut and high luminance while achieving a desired whiteness. Therefore, the liquid crystal display apparatus 1A having excellent display quality can be obtained.

Moreover, in the lighting device 10A and the liquid crystal display apparatus 1A according to the present modification example, the second fluorescent sheet 16 including the third fluorescent substance further includes the fourth fluorescent substance that absorbs the light emitted from at least the light emitting element to emit the light having a emission peak wavelength in a wavelength range of 500 nm to 580 nm.

With this, since the green component can be compensated, it is possible to obtain the lighting device 10A capable of irradiating light with a wide color gamut and high luminance while further achieving a desired whiteness.

Figure 10:
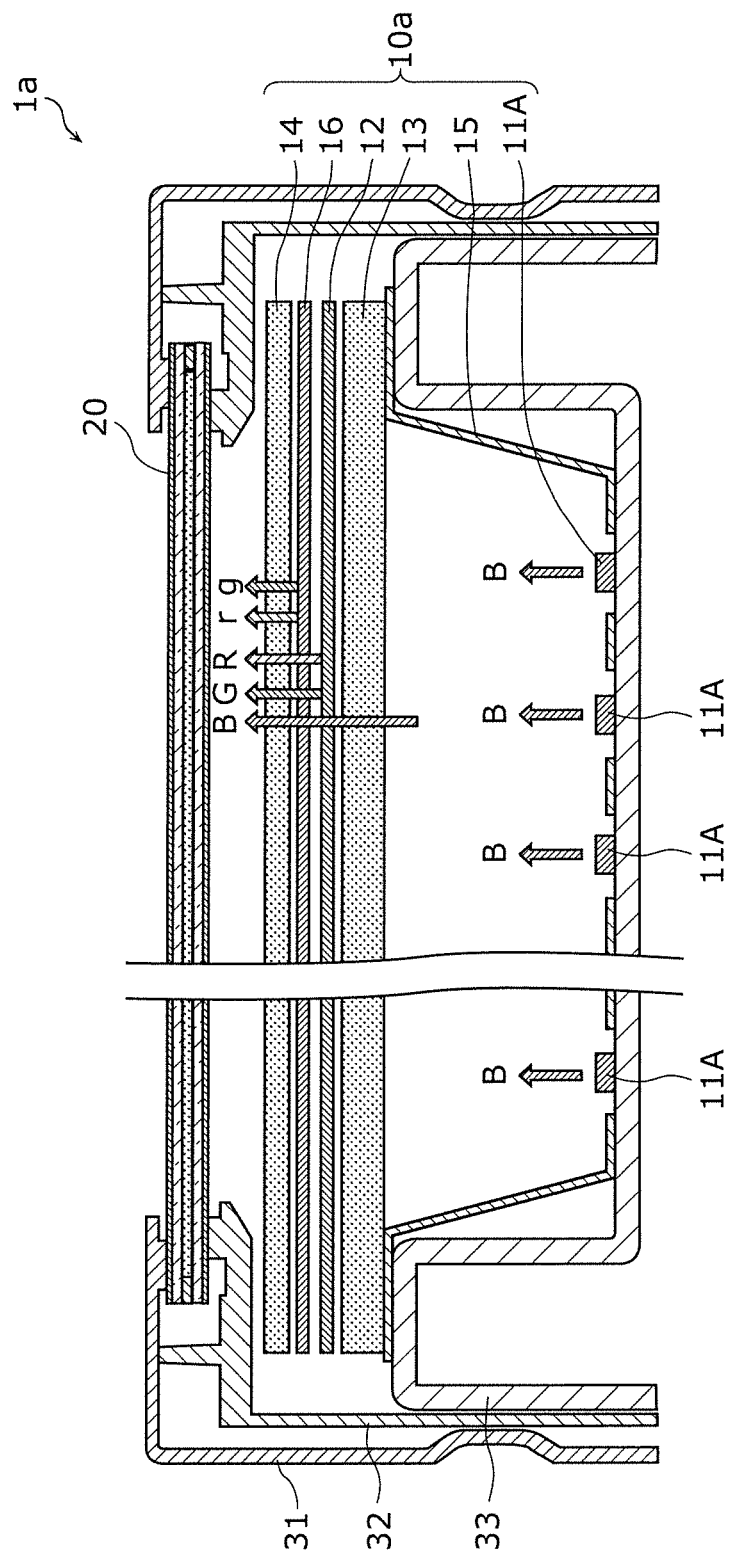
FIG. 10 is a sectional view schematically illustrating another configuration of the liquid crystal display apparatus according to Modification Example 1.

Note that, in the lighting device 10A and the liquid crystal display apparatus 1A as illustrated in FIG. 9, the second fluorescent sheet 16 including the third fluorescent substance and the fourth fluorescent substance is disposed between the light source 11 and the fluorescent sheet 12 (the first fluorescent sheet); however, the position of the second fluorescent sheet 16 is not limited to this. For example, similar to a lighting device 10a and a liquid crystal display apparatus 1a as illustrated in FIG. 10, the second fluorescent sheet 16 including the third fluorescent substance and the fourth fluorescent substance may be disposed on a side of the fluorescent sheet 12 (the first fluorescent sheet), the side being opposite to a side facing the light source. Specifically, in the present modification example, the second fluorescent sheet 16 is disposed between the fluorescent sheet 12 (the first fluorescent sheet) and the optical sheet 14.

Also in this case, the same effects as those of the lighting device 10A and the liquid crystal display apparatus 1A illustrated in FIG. 9 are obtained. That is, it is possible to obtain the lighting device 10a capable of irradiating light with a wide color gamut and high luminance while further achieving a desired whiteness. Therefore, the liquid crystal display apparatus 1a having excellent display quality can be obtained.

In particular, since the second fluorescent sheet 16 including the third fluorescent substance is disposed closer to the display surface than the second fluorescent substance included in the fluorescent sheet 12, there is a low possibility that the red light (r) emitted from the second fluorescent sheet 16 is absorbed by the second fluorescent substance. For this reason, in the lighting device 10a and the liquid crystal display apparatus 1a as illustrated in FIG. 10, it is possible to suppress that the second fluorescent substance absorbs the red light (r) emitted from the second fluorescent sheet 16 to reduce the utilization efficiency of the light.

In addition, since the second fluorescent sheet 16 including the fourth fluorescent substance is disposed closer to the display surface than the first fluorescent substance included in the fluorescent sheet 12, there is a low possibility that the green light (g) emitted from the second fluorescent sheet 16 is absorbed by the first fluorescent substance. For this reason, in the lighting device 10a and the liquid crystal display apparatus 1a as illustrated in FIG. 10, it is possible to suppress that the first fluorescent substance absorbs the green light (g) emitted from the second fluorescent sheet 16 to reduce the utilization efficiency of the light.

In the present modification example, the second fluorescent sheet 16 includes the third fluorescent substance and the fourth fluorescent substance. However, the present embodiment is not limited to this. The second fluorescent sheet 16 may include only the third fluorescent substance among the third fluorescent substance and the fourth fluorescent substance.

Modification Example 2

Figure 11:
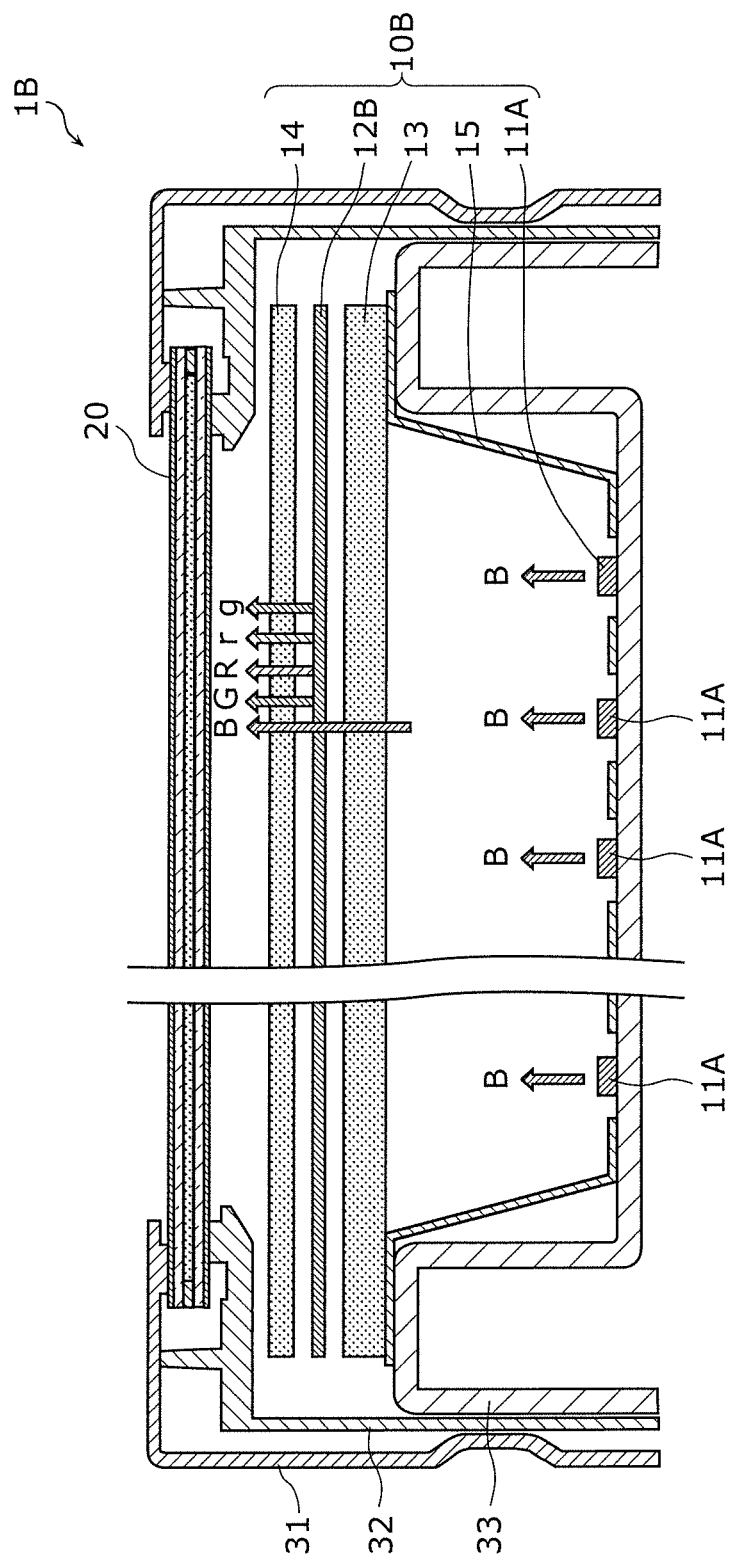
FIG. 11 is a sectional view schematically illustrating a configuration of a liquid crystal display apparatus according to Modification Example 2.

Next, a liquid crystal display apparatus 1B and a lighting device 103 according to Modification Example 2 will be described with reference to FIG. 11. FIG. 11 is a sectional view schematically illustrating a configuration of the liquid crystal display apparatus 1B according to Modification Example 2.

In the liquid crystal display apparatus 1 and the lighting device 10 according to the above-described embodiment, the light source 11 includes the third fluorescent substance and the fourth fluorescent substance; whereas, as illustrated in FIG. 11, in the liquid crystal display apparatus 13 and the lighting device 10B according to the present modification, the third fluorescent substance and the fourth fluorescent substance are included in a fluorescent sheet 12B.

That is, the fluorescent sheet 12B in the present modification example has a configuration in which the third fluorescent substance and the fourth fluorescent substance are further included in the fluorescent sheet 12 in the above embodiment. Therefore, the fluorescent sheet 12B in the present modification example includes the first fluorescent substance, the second fluorescent substance, the third fluorescent substance, and the fourth fluorescent substance.

In the liquid crystal display apparatus 1B and the lighting device 10B configured as described above, the blue light (B) emitted from the light source 11A is diffused by the diffusion plate 13 and incident on the fluorescent sheet 12B. At this time, the fluorescent sheet 12B includes the third fluorescent substance having an absorption spectrum and an emission spectrum illustrated in FIG. 5, the fourth fluorescent substance having an absorption spectrum and an emission spectrum illustrated in FIG. 6, the first fluorescent substance having an absorption spectrum illustrated in FIG. 7A and an emission spectrum illustrated in FIG. 7B, and the second fluorescent substance having an absorption spectrum illustrated in FIG. 8A and an emission spectrum illustrated in FIG. 8B.

Therefore, the fluorescent sheet 12B emits the red light (r) from the third fluorescent substance that has absorbed and fluoresced using a part of the blue light (B) of the blue LED chip; the green light (g) from the fourth fluorescent substance that has absorbed and fluoresced using a part of the blue light (B) of the blue LED chip; the green light (G) from the first fluorescent substance that has absorbed and fluoresced using a part of the blue light (B) of the blue LED chip; the red light (R) from the second fluorescent substance that has absorbed and fluoresced using the green light (G) from the first fluorescent substance and the green light (g) from the fourth fluorescent substance; and the blue light (B) of the blue LED chip that has transmitted through the fluorescent sheet 12B without being absorbed by the first fluorescent substance and the third fluorescent substance.

As a result, as in the above embodiment, the fluorescent sheet 12B emits white light in which the blue light (B) by the blue LED chip, the green light (G) by the first fluorescent substance, the red light (R) by the second fluorescent substance, the red light (r) by the third fluorescent substance, and the green light (g) by the fourth fluorescent substance are synthesized.

As described above, similar to the lighting device 10 and the liquid crystal display apparatus 1 according to the above embodiment, the lighting device 10B and the liquid crystal display apparatus 1B according to the present modification example include not only the first fluorescent substance and the second fluorescent substance of the fluorescent sheet 12B which is a wide color gamut fluorescent sheet, but also the third fluorescent substance that emits the red light by being excited by the light of the light emitting element included in the light source 11A without being substantially excited by the light of the first fluorescent substance and the second fluorescent substance.

Therefore, since the red component that has been lacking in the wide color gamut fluorescent sheet can be compensated while ensuring the luminance, it is possible to obtain the lighting device 10B capable of irradiating light with a wide color gamut and high luminance while achieving a desired whiteness. Therefore, the liquid crystal display apparatus 1B having excellent display quality can be obtained.

Moreover, in the lighting device 10B and the liquid crystal display apparatus 1B according to the present modification example, the fluorescent sheet 12B further includes the fourth fluorescent substance that absorbs the light emitted from at least the light emitting element to emit the light having a emission peak wavelength in a wavelength range of 500 nm to 580 nm.

With this, since the green component can be compensated, it is possible to obtain the lighting device 10B capable of irradiating light with a wide color gamut and high luminance while further achieving a desired whiteness.

In the present modification example, the fluorescent sheet 12B includes the third fluorescent substance and the fourth fluorescent substance. However, the present embodiment is not limited to this. The second fluorescent sheet 12B may include only the third fluorescent substance among the third fluorescent substance and the fourth fluorescent substance.

Modification Example 3

Figure 12:
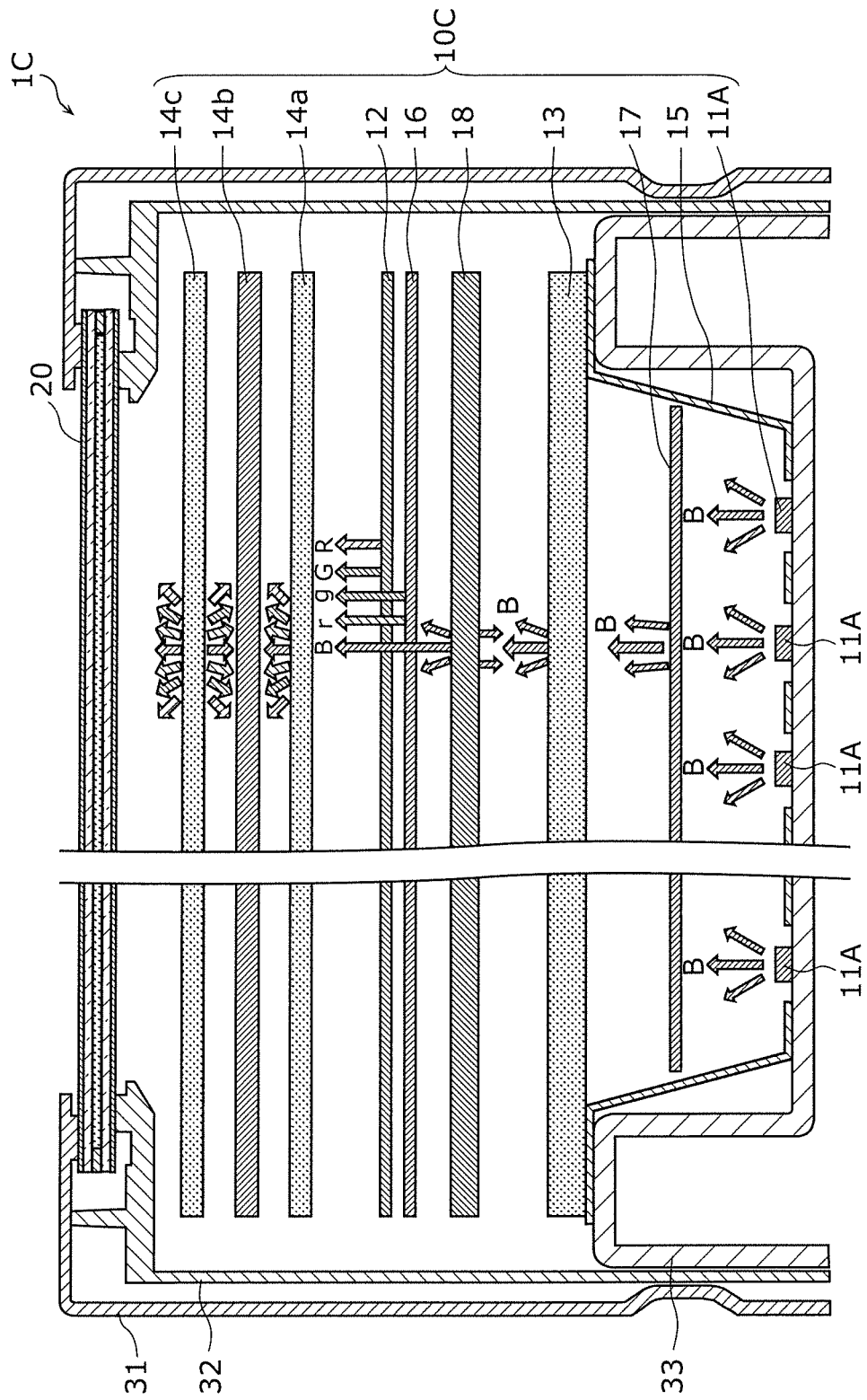
FIG. 12 is a sectional view schematically illustrating a configuration of a liquid crystal display apparatus according to Modification Example 3.

Next, a liquid crystal display apparatus 1C and a lighting device 10C according to Modification Example 3 will be described with reference to FIG. 12. FIG. 12 is a sectional view schematically illustrating a configuration of the liquid crystal display apparatus 1C according to Modification Example 3.

As illustrated in FIG. 12, the liquid crystal display apparatus 1C and the lighting device 10C according to the present modification example further includes a flutter plate 17 and a cross prism sheet 18 with respect to the liquid crystal display apparatus 1A and the lighting device 10A as illustrated in FIG. 9.

The flutter plate 17 is disposed in front of a plurality of light sources 11A, and the flutter plate 17 is provided with innumerable pores through which light passes. With this, the plurality of light sources 11A can be further divided into countless point light sources. The flutter plate 17 is white and has a reflection function. Therefore, since the light source 11A, the flutter plate 17, and the diffusion plate 13 exist via the air layer, the light of the light source 11A can be diffusely reflected and mixed between them, and therefore, the luminance can be made uniform over the entire area of the diffusion plate 13. That is, planar light with high luminance uniformity can be extracted from the diffusion plate 14.

The cross prism sheet 18 has a structure in which two prism sheets are combined so that the arrangement directions of the prisms are orthogonal to each other.

Moreover, in the present modification example, the optical sheet 14 in the above embodiment is configured by a plurality of sheets of a diffusion plate 14a, a prism sheet 14b, and a polarizing sheet 14c. The diffusion plate 14a, the prism sheet 14b, and the polarizing sheet 14c are stacked in this order in the direction from the light source 11A to the liquid crystal display panel 20. Note that, the polarizing sheet 14c is an optical sheet having a function of aligning the polarization direction of light in one direction. Specifically, the polarizing sheet 14c is a reflective polarizing film, for example, a dual brightness enhancement film (DBEF) manufactured by 3M.

As described above, the lighting device 10C and the liquid crystal display apparatus 1C according to the present modification example exhibit the same effects as those of the lighting device 10A and the liquid crystal display apparatus 1A according to Modification Example 1. That is, it is possible to obtain the lighting device 10C capable of irradiating light with a wide color gamut and high luminance while further achieving a desired whiteness. Therefore, the liquid crystal display apparatus 1C having excellent display quality can be obtained.

In addition, in the lighting device 10C and the liquid crystal display apparatus 1C according to the present modification, the flutter plate 17 is disposed as a luminance uniform plate between the light source 11 and the diffusion plate 14, and therefore, the light source 11A with high luminance can be used. That is, even if the light source 11A with high luminance is provided, the planar light with high luminance uniformity can be obtained by disposing the flutter plate 17. Therefore, since the lighting device 10C which can irradiate light with higher luminance can be obtained, the liquid crystal display apparatus 1C having further excellent display quality can be realized.

Modification Examples

As described above, the lighting device and the liquid crystal display apparatus according to the present disclosure have been described based on the embodiments, but the present disclosure is not limited to the above embodiments.

For example, in the above-described embodiment, the first fluorescent substance and the second fluorescent substance are included in the sheet member separately disposed in front of the light source to form the fluorescent sheet. However, the configuration thereof is not limited to this. Specifically, the first fluorescent substance and the second fluorescent substance may be included in the light source, or may be included in an existing optical member or the like disposed in front of the light source. Similarly, the third fluorescent substance and the fourth fluorescent substance are not included in the fluorescent sheet and the light source including the first fluorescent substance and the second fluorescent substance, but may be included in existing optical members arranged in front of the light source.

For example, in the above embodiment, the light emitting element used for the light source 11 is the blue LED chip that emits the blue light, but is not limited thereto. For example, an LED chip that emits UV light may be used. The light emitting element used for the light source 11 is not limited to the LED, and solid light emitting elements other than LEDs, for example, a semiconductor light emitting element such as a semiconductor laser or a superluminescent diode, or an electro luminescence element such as an organic EL may be used.

Moreover, in the above embodiments, the case where the lighting device 10 is used as a backlight of the liquid crystal display apparatus 1 is illustrated, but the application of the lighting device is not limited to this, and the lighting device 10 can be applied to various apparatuses or systems other than the liquid crystal display apparatus. For example, the lighting device 1 can be applied to a lighting fixture such as a ceiling light or a downlight.

Those skilled in the art will readily appreciate that many modifications are possible in the above exemplary embodiment and variations without materially departing from the novel teachings and advantages of the present disclosure. Accordingly, all such modifications are intended to be included within the scope of the present disclosure.

What is claimed is:

1. A lighting device comprising:
 a light source including a light emitting element that emits light having an emission peak wavelength in a wavelength range of 500 nm or less; and
 a first fluorescent substance, a second fluorescent substance, and a third fluorescent substance on which light emitted from the light emitting element is incident,
 wherein the first fluorescent substance absorbs at least light emitted from the light emitting element to emit light having a emission peak wavelength in a wavelength range of 500 nm to 580 nm,
the second fluorescent substance absorbs at least light emitted from the first fluorescent substance to emit light having a emission peak wavelength in a wavelength range of 580 nm to 750 nm, and
the third fluorescent substance absorbs light having a wavelength range of 500 nm or less to emit light having a emission peak wavelength in a wavelength range of 600 nm to 750 nm.

2. The lighting device according to claim 1,
wherein the first fluorescent substance emits light having a emission peak wavelength in a wavelength range of 500 nm to 550 nm,
the second fluorescent substance emits light having a emission peak wavelength in a wavelength range of 580 nm to 680 nm, and
the third fluorescent substance emits light having a emission peak wavelength in a wavelength range of 600 nm to 650.

3. The lighting device according to claim 2,
wherein the first fluorescent substance has an absorption spectrum peak in a wavelength range of 470 nm to 520 nm,
the second fluorescent substance has an absorption spectrum peak in a wavelength range of 550 nm to 620 nm, and
the third fluorescent substance has an absorption spectrum peak in a wavelength range of 430 nm to 470 nm.

4. The lighting device according to claim 1,
wherein the light emitting element emits light having an emission peak wavelength in a wavelength range of 400 nm to 500 nm.

5. The lighting device according to claim 4,
wherein the light source includes the third fluorescent substance.

6. The lighting device according to claim 5,
wherein the light source further includes a fourth fluorescent substance that absorbs at least light emitted from the light emitting element to emit light having a emission peak wavelength in a wavelength range of 500 nm to 580 nm.

7. The lighting device according to claim 1, further comprising:
a first fluorescent sheet including the first fluorescent substance and the second fluorescent substance, and a second fluorescent sheet including the third fluorescent substance,
wherein the second fluorescent sheet is disposed between the light source and the first fluorescent sheet.

8. The lighting device according to claim 1, further comprising:
a first fluorescent sheet including the first fluorescent substance and the second fluorescent substance, and a second fluorescent sheet including the third fluorescent substance,
wherein the second fluorescent sheet is disposed on a side of the first fluorescent sheet, the side being opposite to a side facing the light source.

9. The lighting device according to claim 7,
wherein the second fluorescent sheet further includes a fourth fluorescent substance that absorbs at least light emitted from the light emitting element to emit light having a emission peak wavelength in a wavelength range of 500 nm to 580 nm.

10. The lighting device according to claim 8,
wherein the second fluorescent sheet further includes a fourth fluorescent substance that absorbs at least light emitted from the light emitting element to emit light having a emission peak wavelength in a wavelength range of 500 nm to 580 nm.

11. The lighting device according to claim 1, further comprising:
a first fluorescent sheet including the first fluorescent substance, the second fluorescent substance, and the third fluorescent substance.

12. The lighting device according to claim 11,
wherein the first fluorescent sheet further includes a fourth fluorescent substance that absorbs at least light emitted from the light emitting element to emit light having an emission peak wavelength in a wavelength range of 500 nm to 580 nm.

13. The lighting device according to claim 1,
wherein the light emitting element is a blue LED chip that emits a blue light.

14. A liquid crystal display apparatus comprising:
the lighting device according to claim 1, and
a liquid crystal display panel disposed on a light emission side of the lighting device.

* * * * *